(12) United States Patent
MacManus (10) Patent No.: US 12,489,232 B2
(45) Date of Patent: Dec. 2, 2025

(54) RIGHT ANGLED BLIND MATE INTERCONNECTION

(71) Applicant: Rakuten Symphony, Inc., Tokyo (JP)

(72) Inventor: Gerard MacManus, Surrey (GB)

(73) Assignee: Rakuten Symphony, Inc., Tokyo (JP)

( * ) Notice: Subject to any disclaimer, the term of this patent is extended or adjusted under 35 U.S.C. 154(b) by 332 days.

(21) Appl. No.: 18/020,476

(22) PCT Filed: Jul. 20, 2022

(86) PCT No.: PCT/US2022/037744
§ 371 (c)(1),
(2) Date: Feb. 9, 2023

(87) PCT Pub. No.: WO2024/019718
PCT Pub. Date: Jan. 25, 2024

(65) Prior Publication Data
US 2024/0030634 A1    Jan. 25, 2024

(51) Int. Cl.
*H01R 12/71* (2011.01)
*H01R 13/631* (2006.01)

(52) U.S. Cl.
CPC ......... *H01R 12/716* (2013.01); *H01R 13/631* (2013.01)

(58) Field of Classification Search
CPC .. H01R 12/716; H01R 13/631; H01R 12/732; H05K 2201/09145; H05K 2201/10189; H05K 2203/167; H05K 1/142
See application file for complete search history.

(56) References Cited

U.S. PATENT DOCUMENTS

| | | | | |
|---|---|---|---|---|
| 4,420,203 A | * | 12/1983 | Aug ........................ | H01L 23/32 439/71 |
| 4,938,701 A | * | 7/1990 | Heberling ............ | H05K 7/1417 439/74 |

(Continued)

OTHER PUBLICATIONS

International Search Report and Written Opinion of the International Searching Authority issued by the United States Patent and Trademark Office for corresponding International Patent Application No. PCT/US22/37744, electronically delivered on Oct. 18, 2022.

*Primary Examiner* — Peter G Leigh
*Assistant Examiner* — Nader J Alhawamdeh
(74) *Attorney, Agent, or Firm* — Myers Wolin, LLC (57) ABSTRACT

A circuit board connection system is provided having a first circuit board having a first connector and a second circuit board having a second connector for mating with the first connector. A chassis is provided for mounting the first circuit board and the second circuit board, and when assembled, the first circuit board and the second circuit board lie parallel to a mounting surface of the chassis. At least one first alignment feature is fixed to or integrated into the first circuit board and at least one complementary alignment feature is fixed to or integrated into the second circuit board or the mounting surface of the chassis. An interaction between the first alignment feature and the complementary alignment feature forces alignment of the first connector with the second connector as the first circuit board is moved towards the second circuit board along the mounting surface of the chassis.

17 Claims, 9 Drawing Sheets

(56) References Cited

U.S. PATENT DOCUMENTS

| | | | | |
|---|---|---|---|---|
| 6,330,154 B1* | 12/2001 | Fryers | ............... | H05K 7/20145 |
| | | | | 361/695 |
| 6,496,376 B1* | 12/2002 | Plunkett | ............... | H05K 7/1441 |
| | | | | 361/792 |
| 10,398,032 B1 | 8/2019 | Bailey et al. | | |
| 10,680,366 B1* | 6/2020 | Huang | ............... | H01R 12/725 |
| 2018/0219329 A1* | 8/2018 | Morgan | ............ | H01R 13/6585 |
| 2020/0375039 A1* | 11/2020 | Mudd | .................. | H05K 5/0204 |
| 2021/0119363 A1* | 4/2021 | Perry | .................... | H05K 3/368 |
| 2024/0030634 A1* | 1/2024 | MacManus | .......... | H01R 13/631 |

* cited by examiner

RIGHT ANGLED BLIND MATE INTERCONNECTION

CROSS-REFERENCE TO RELATED APPLICATION

This application is a national stage application of International Application No. PCT/US2022/037744, filed on Jul. 20, 2022 and the contents of which are herein incorporated by reference.

FIELD OF THE INVENTION

This application relates to PCB board connectors having right angled interconnections.

BACKGROUND

In order to connect multiple circuit boards, such as printed circuit boards (PCBs), electrical connectors are required. Such connectors may have conductive pins used for mating adjacent circuit boards. Typically, connectors would be provided in pairs, where a first such connector is male, thereby providing a plurality of pins carrying either power or data, and a second connector is female, thereby providing sockets for receiving the pins.

A challenge is presented when connecting adjacent PCBs aligned on a single plane. Because power or data signals are drawn from a typically planar PCB, and are then directed towards contacts in the adjacent typically planar PCB, contacts must rotate towards the adjacent PCB. This results in right angled mates, where each of the male and female connector of a pair must direct redirect contacts ninety degrees.

Often, such right angled connections have limited access or visibility, resulting in blind or nearly blind mating requirements. In such scenarios, it is difficult to align connectors prior to connecting the male to female connectors. A misalignment could result in bend pins, broken connectors, or damage to the PCB on which the connectors are installed.

Such right angled blind mate connections are typically managed by the connector itself, resulting in a limited set of connectors with preconfigured housings, or as a larger assembly, typically requiring one side of the interconnection PCB assembly to float, thereby preventing rigid alignment of the PCBs on the same plane.

Specialized blind mate connectors are often provided with shrouds, used to guide pins or connectors towards each other. This results in bulky connectors, and limits assemblies to the specialized connectors manufactured for such blind mates. Typically, such connectors are available for power connections and some data connections, but are not available for data connections with a large number of interconnections. For example, for many radio unit or digital unit products, the number of required interconnects may be very high.

When standard connections are used, no shrouding or other mechanism is used to control alignment, and as such, the assembly is uncontrolled. Connectors may be fragile, particularly where a large number of interconnects are present, and the resulting mis-alignment can result in damage to the connectors or the PCB.

Further, in many radio unit or digital unit products, multiple interconnected PCBs must be connected on a fixed plane, such as on a surface of a chassis with an integrated heatsink. In such a scenario, a floating connection would not be possible. Finally, in the context of a chassis, both PCBs ultimately are expected to rest on a surface of the chassis. However, the PCBs typically should not slide along a surface of the chassis, since such sliding could damage the surface of the chassis or a lower surface of the PCB, each of which may have integrated fragile features.

Further, because of packaging demands, a chassis may be provided with a sidewall, and a surface of the chassis may be sized to precisely fit the two adjacent PCBs with little excess clearance. As such, when attempting to connect a first PCB to a second PCB already fixed to the chassis, the first PCB may not be able to approach horizontally along the surface of the chassis, since such an approach may be blocked by the chassis sidewall.

There is a need for an interconnection system for circuit boards that allows the use of a generic right angle connector, rather than a specialized blind mate connector. There is a further need for such a connection that allows PCBs to share a single plane, such as on a surface of a chassis heatsink, while allowing for flexibility in how the first PCB approaches the second PCB.

SUMMARY

A circuit board connection system is provided having a first circuit board having a first connector and a second circuit board having a second connector for mating with the first connector.

A chassis is provided for mounting the first circuit board and the second circuit board, and when assembled, the first circuit board and the second circuit board lie parallel to a mounting surface of the chassis. At least one first alignment feature is fixed to or integrated into the first circuit board and at least one complementary alignment feature is fixed to or integrated into the second circuit board or the mounting surface of the chassis.

An interaction between the first alignment feature and the complementary alignment feature forces alignment of the first connector with the second connector as the first circuit board is moved towards the second circuit board along the mounting surface of the chassis.

In some embodiments, one of the first and second connectors is a female connector and the other is a male connector, The at least one alignment feature, upon engagement with the at least one complementary alignment feature, allows only linear motion along a plane of the chassis in a direction of the connection pins of the male connector.

In some such embodiments, the at least one alignment feature is a notch in a first edge of the first circuit board aligned with sockets of the female connector. In some such embodiments, the at least one complementary alignment feature is an alignment pin fixed to the mounting surface and extending perpendicular to the mounting surface. The second circuit board may then be located on the chassis adjacent the alignment pin.

In some such embodiments, the second circuit board is fixed to the chassis prior to an introduction of the first circuit board.

In some embodiments, the alignment pin has a head having a width larger than a width of the notch and a shaft extending from the mounting surface to the head longer than a thickness of the first circuit board. In some such embodiments, a lower surface of the head of the alignment pin is tapered.

In some such embodiments, an angle of the taper defines a maximum allowable approach angle of the first circuit board relative to the mounting surface during alignment.

In some such embodiments, the taper of the lower surface of the head of the alignment pin has distinct segments having different taper angles. A first segment then has first angle relative to the mounting surface at a first radial distance from the shaft and a second segment has a second angle relative to the mounting surface at a second radial distance from the shaft. The second angle may be smaller than the first angle, such that the maximum allowable approach angle is reduced as the first edge approaches a plane parallel to the first edge defined by the shaft.

In some embodiments, the mounting surface of the chassis has a wall extending perpendicular from the mounting surface, and the first circuit board has a length in the direction of the sockets of the female connector. A distance from the alignment pin to the wall is then less than the length of the first circuit board.

In embodiments in which the length of the shaft is larger than the thickness of the first circuit board, the length of the shaft may be substantially similar to the thickness of the first circuit board with an added tolerance, such that after the first edge passes the plane defined by the shaft, the first circuit board can be translated towards the second circuit board only if flat on the mounting surface.

In some such embodiments, a distance between the second circuit board and the shaft of the alignment in is larger than a length of the alignment pins of the male connector, such that alignment is forced before the first connector is in range of the pins.

In some embodiments, the at least one alignment feature is two parallel notches in the first circuit board adjacent opposite ends of the female connector and aligned with sockets of the female connector. The second circuit board is then fixed on the chassis and the at least one complementary alignment feature is two alignment pins fixed to the mounting surface and extending perpendicular to the mounting surface adjacent opposite ends of the male connector.

In some such embodiments, each of the two alignment pins has a head having a width larger than a width of the notch and a shaft extending from the mounting surface to the head larger than a thickness of the first circuit board. In such an embodiment, a lower surface of the head of each alignment pin is tapered, with an angle of the taper defining a maximum allowable approach angle of the first circuit board relative to the mounting surface during alignment.

In some embodiments, the chassis provides cooling features opposite the mounting surface.

In some embodiments, the mounting surface includes a detent adjacent a mounting location of the second circuit board, such that the second connector is spaced apart form the mounting surface.

In some embodiments, the first connector and the second connector are high-speed right-angle connectors.

In some embodiments, the first connector and the second connector are data connectors.

DETAILED DESCRIPTION OF THE PREFERRED EMBODIMENTS

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

Figure 1:
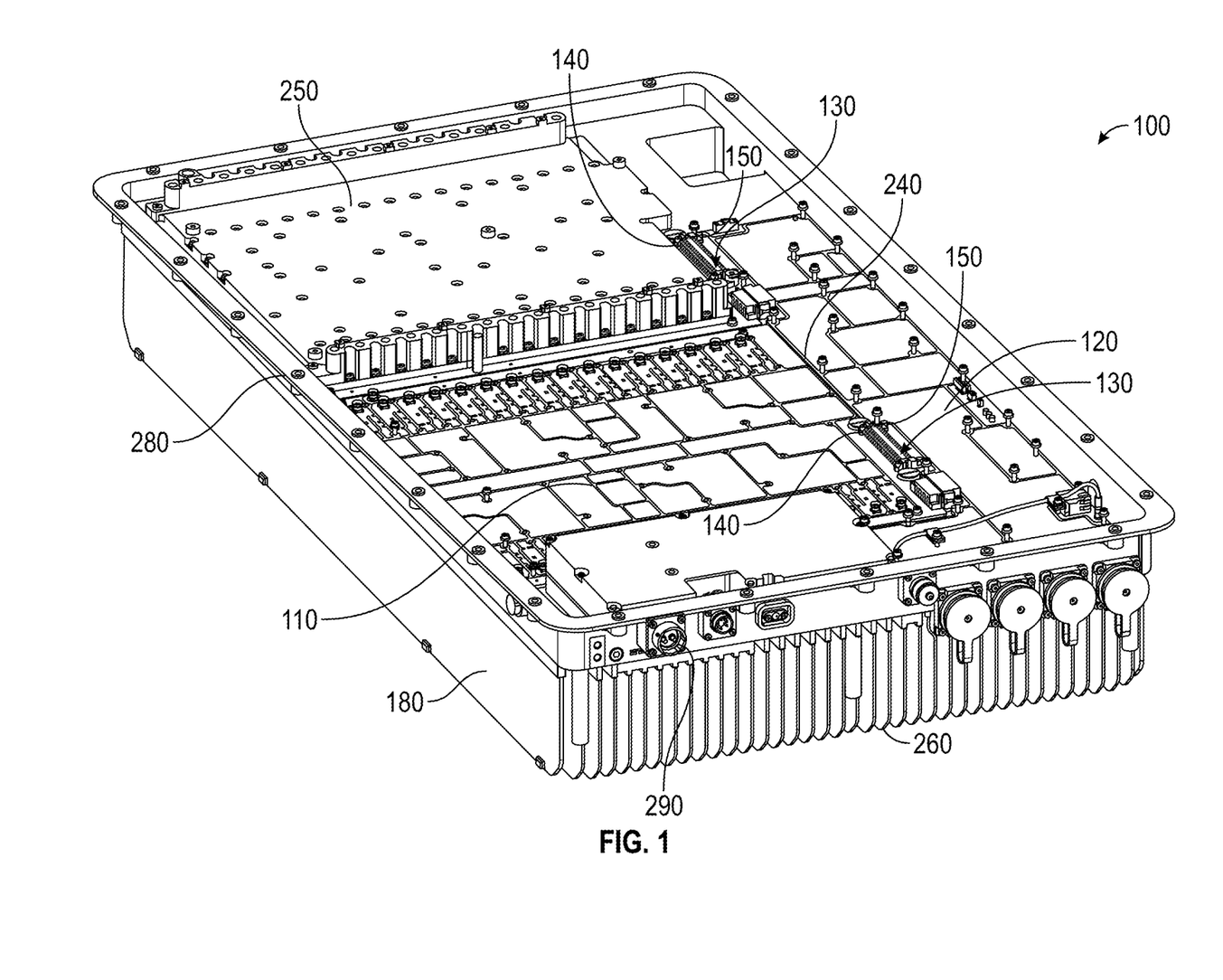
FIG. 1 is an embodiment of a system having multiple PCBs connected by way of multiple right angled blind mate interconnections in accordance with this disclosure.
Figure 2:
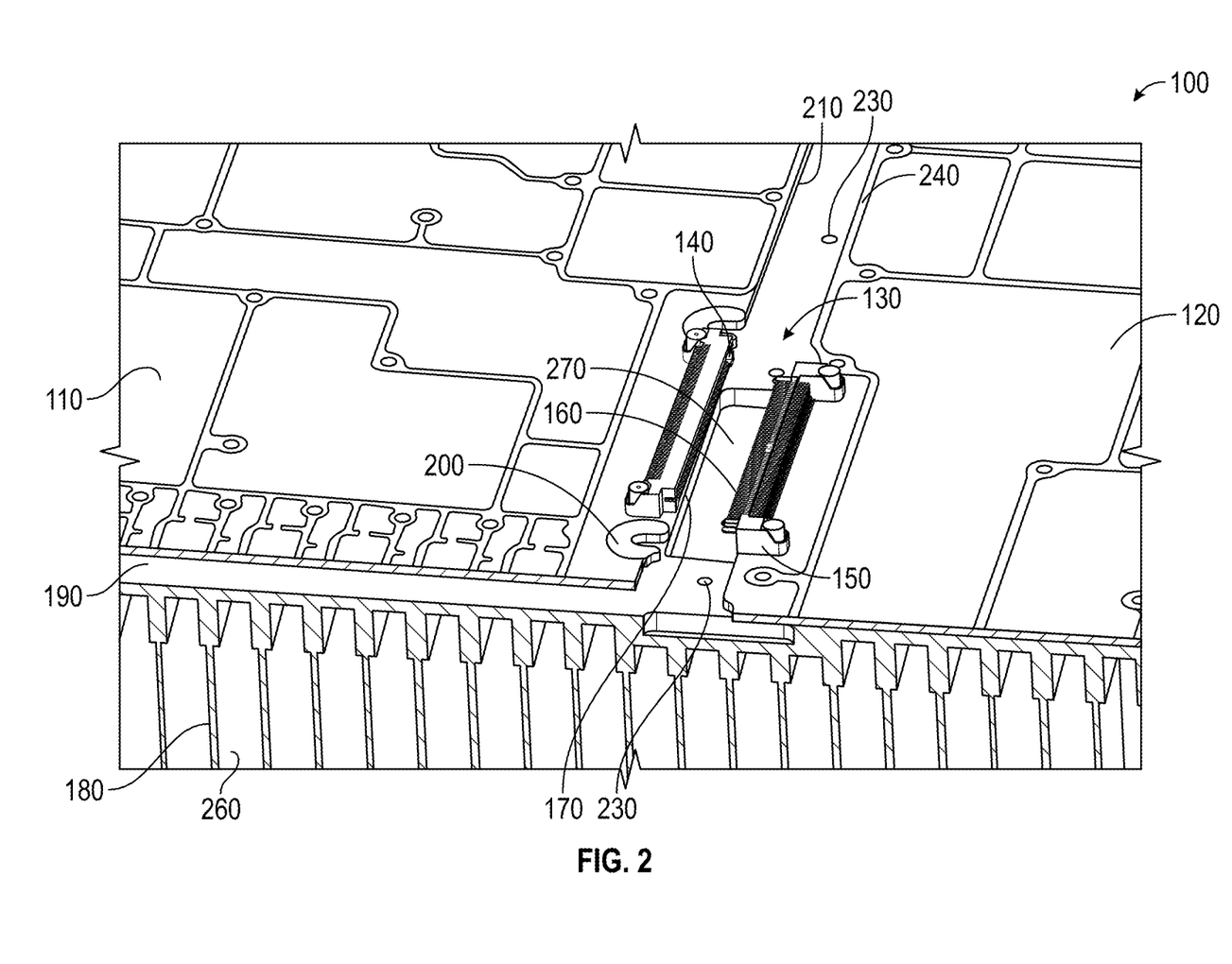
FIG. 2 shows components of a right angled blind mate interconnection prior to connection.
Figure 3:
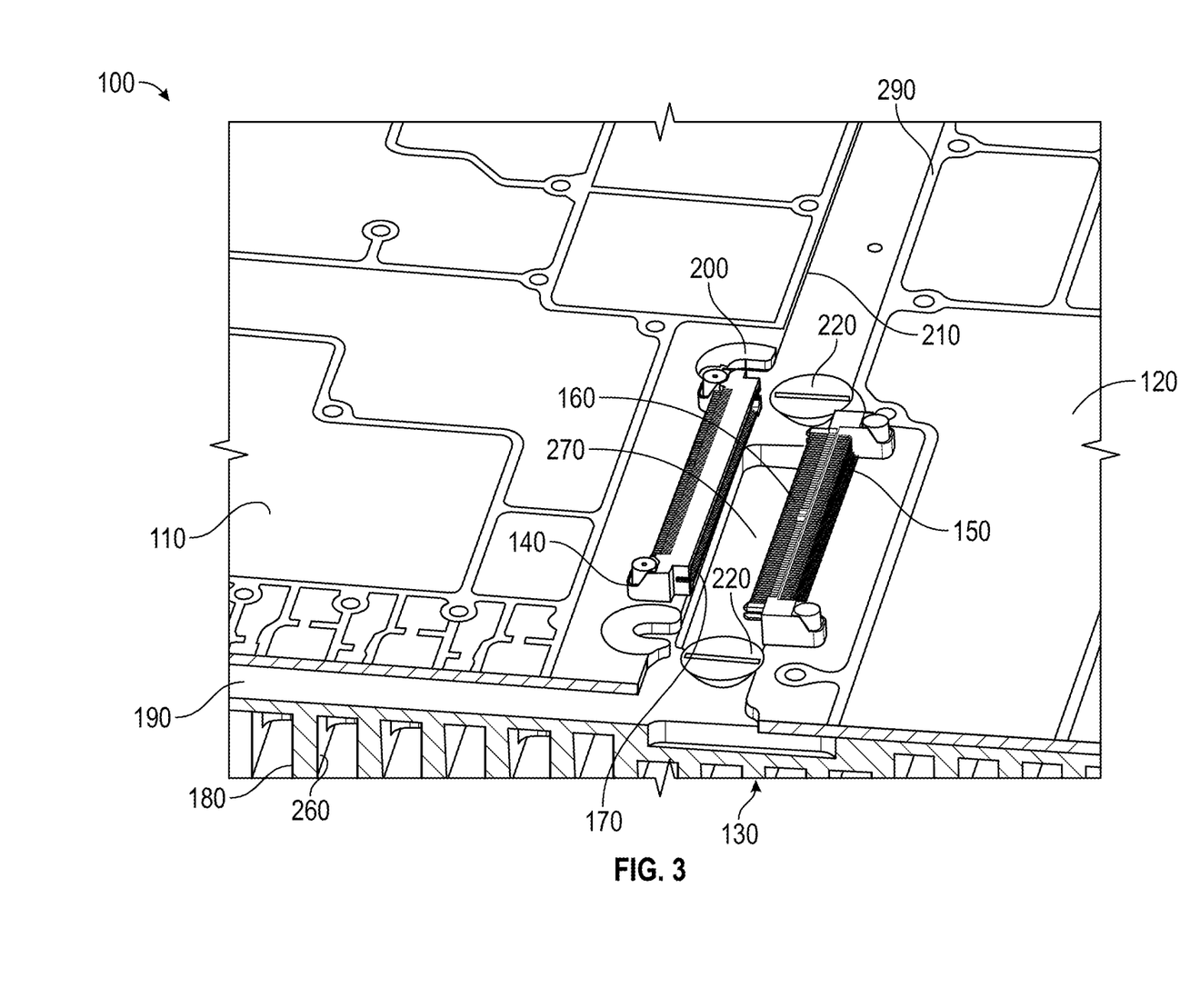
FIG. 3 shows components of a right angled blind mate interconnection prior to connection.

FIG. 1 is an embodiment of a system 100 having multiple PCBs 110, 120 connected by way of multiple right angled blind mate interconnections 130 in accordance with this disclosure. FIG. 2 shows components of a right angled blind mate interconnection 130 prior to connection. FIG. 3 shows components of a right angled blind mate interconnection 130 prior to connection.

A shown, the circuit board connection system 100 typically includes a first circuit board, such as a PCB 110, having a first connector 140, and a second circuit board, also a PCB 120, having a second a second connector 150. The first connector 140 and the second connector 150 are typically right angle connectors which connect contact points or leads on the first PCB 110 to contact points or leads on the second PCB 120. Typically, one of the connectors 140 is female and the second connector 150 is male. The male connector 150 therefore provides a plurality of connection pins 160 which mate with sockets 170 of the female connector 140. The connectors 140, 150 may be high speed right angle connectors. Further, the connectors 140, 150 may be data connectors or power connectors or a combination thereof.

The connection system 100 also includes a chassis 180 for mounting the first circuit board 110 and the second circuit board 120. When assembled, as shown in FIG. 1, the first circuit board 110 and the second circuit board 120 lie parallel to a mounting surface 190 of the chassis.

Each right angled blind mate interconnection 130 typically includes the first and second connector 140, 150, as well as at least one first alignment feature 200 fixed to or integrated into the first circuit board 110. As shown, the first alignment feature 200 may be a slot or notch integrated into an edge 210 of the first circuit board 110.

In the embodiment shown, the first connector 140 integrated into the first circuit board 110 is female, and the first alignment feature 200 is provided in the first circuit board as a slot or notch. In such an embodiment, the slot or notch is aligned with the sockets 170 of the female connector 140. Alternatively, if the first alignment feature 200 to be located on a circuit board having a male connector 150, the first slot or notch would be aligned with the connection pins 160 of the male connector.

Also provided is at least one co-mplimentary alignment feature 220 fixed to or integrated into the second circuit board 120 or the mounting surface 190 of the chassis 180. As shown, the complementary alignment feature 220 may be an alignment pin fixed to the mounting surface 190 and extending perpendicular to the mounting surface.

During assembly of the circuit boards 110, 120 onto the chassis 180 using the connection system 100, an interaction between the first alignment feature 200 and the complementary alignment feature 220 forces an alignment of the first connector 140 with the second connector 150 as the first circuit board is moved towards the second circuit board along the mounting surface 190 of the chassis 180.

It is noted that each of the first alignment feature 200 and the complementary alignment feature 220 are integrated either into the circuit board 110, 120 or the mounting surface 190, rather than the connectors themselves 140, 150. As such, the connection system 100 and its corresponding blind mate interconnections 130 are connector agnostic, and are not limited to right angled connectors specially designed for blind mating. Further, because the connection system 100 is not integrated into the connectors 140, 150, the size of the connectors can be dramatically reduced, and a without the bulk of shrouding and specialized housings, a larger number of interconnections between electrical contacts can be maintained.

In the embodiment shown, the second circuit board 120 and the male connector 150 are initially fixed to the chassis. In such a scenario, the first alignment feature 200, upon engagement with the complementary alignment feature 220, allows only linear motion along a plane of the chassis mounting surface 190, and that linear motion is in a direction of the connection pins 160 of the second male connector 150. It is noted that while the alignment feature 220 only allows linear motion along the plane of the chassis mounting surface 190, the blind mate interconnections 130 allow limited motion in a direction perpendicular to the chassis mounting surface. This is discussed in more detail below with respect to the alignment pins provided as complementary alignment features 220.

Where the complementary alignment feature 220 is located on the chassis 190, and not on the second circuit board itself 120, the second circuit board is typically located on the chassis preemptively, prior to introducing the first circuit board 110 to the system 100. Accordingly, the second circuit board 120 may be fixed to the chassis 190 adjacent the complementary alignment feature 220, which may be an alignment pin.

As shown in FIG. 2, in order to support various locations of the second circuit board 120 or various locations of blind mate interconnections 130 with the second circuit board, the chassis 180 may initially be provided without pins, but with various holes 230 in the chassis mounting surface at which pins may be introduced. Accordingly, the second connectors 150 may be provided at various locations along an edge 240 of the second circuit board 120, and pins 220 may be introduced at appropriate locations.

Similarly, as shown in FIG. 1, multiple second connectors 150 may be provided at different locations along the edge 240 of the second circuit board 120. Such connectors 150 may then mate with different circuit boards. In FIG. 1, two such interconnections 130 are shown, with a first such interconnection mating the second circuit board 120 with the first circuit board. A second interconnection 130 is shown, but the connected circuit board is located within a housing 250 fixed to chassis 180.

As shown, in many embodiments, a plurality of first alignment features 200 and second complementary alignment features 220 may be provided. As such, iterations of a first alignment feature 200, namely a slot or notch, may be provided adjacent opposite ends of the first connector 140. Where the first connector is female, both such slots or notches 200 are aligned with sockets of the female connector 140. The second circuit board 120 is then fixed to the chassis 190, and the at least one complementary alignment feature 220 is two alignment pins fixed to the mounting surface 190 and extending perpendicular to the mounting surface adjacent opposite ends of the second connector 150.

As shown, the chassis 180 may be a cooling chassis. As such, the chassis may provide cooling features, such as fins 260, opposite the mounting surface 190. The circuit boards 110, 120 may then be mounted on the chassis 180, and the chassis may be designed to draw heat away from the circuit boards during use.

Further, because the complementary alignment feature 220 is integrated into the mounting surface 190 of the chassis 180 in the embodiment shown, the alignment feature 220 may precisely locate the first and second circuit boards 110, 120 relative to each other and relative to the mounting surface 190. As such, features can be integrated into the mounting surface 190 at precise locations configured to improve the performance of the circuit boards 110, 120 and the interconnections 130.

For example, in the embodiment shown, a detent 270 may be precisely located to be under the interconnection 130 such that the connectors 140, 150 are spaced apart from the mounting surface 190. Accordingly, the interconnection may be provided with a small air gap in order to avoid shorting any pins of the male connector 150, as well as to provide potential for airflow around the connectors. Similarly, cooling features, such as cooling gas chambers and the fins 260 may be located in order to improve cooling performance for specific circuit board configurations.

It is further noted that the chassis 180 may be designed as a partial housing for a complete electronic device. As such, the chassis 180 may include a sidewall 280 which may in turn include various interface ports 290 for connecting the chassis 180 to external devices. As such, the sidewall 280 may create packaging challenges for the device. For example, the presence of the sidewall 280 may complicate an approach angle of the first circuit board 110 during assembly, as there may not be sufficient space between the sidewall and the second circuit board 120 to lay the two circuit boards parallel during assembly. Further, the sidewall 280 may limit visibility, thereby resulting in the interconnection 130 being blind, as well as limiting the ability to automate assembly. The assembly process is discussed in more detail below with respect to FIGS. 6A-10.

Figure 4:
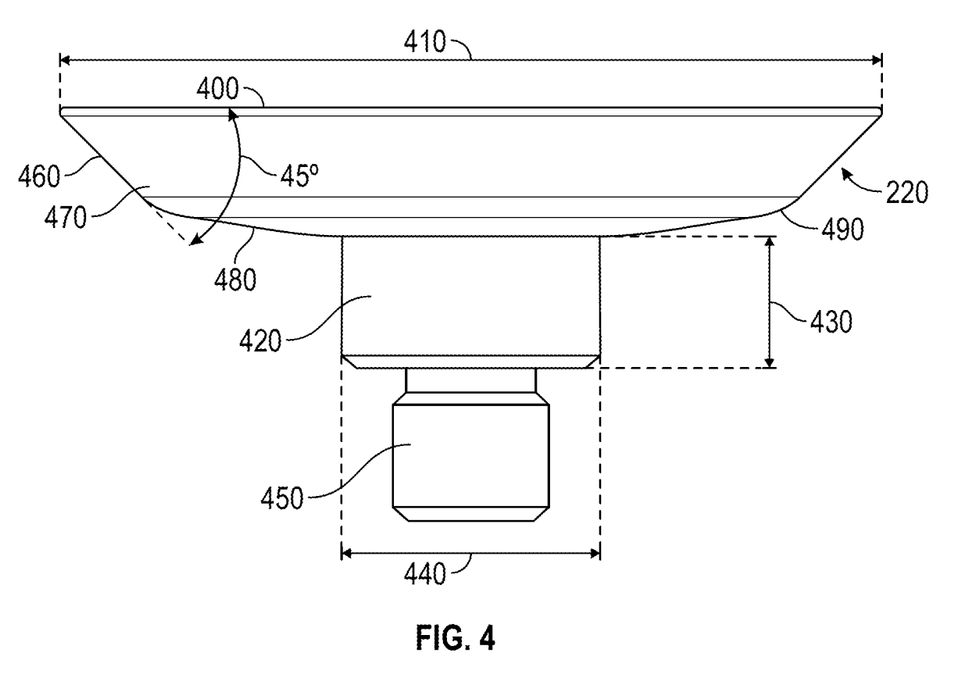
FIG. 4 shows a pin for use in the right angled blind mate interconnection of FIG. 3.
Figure 5:
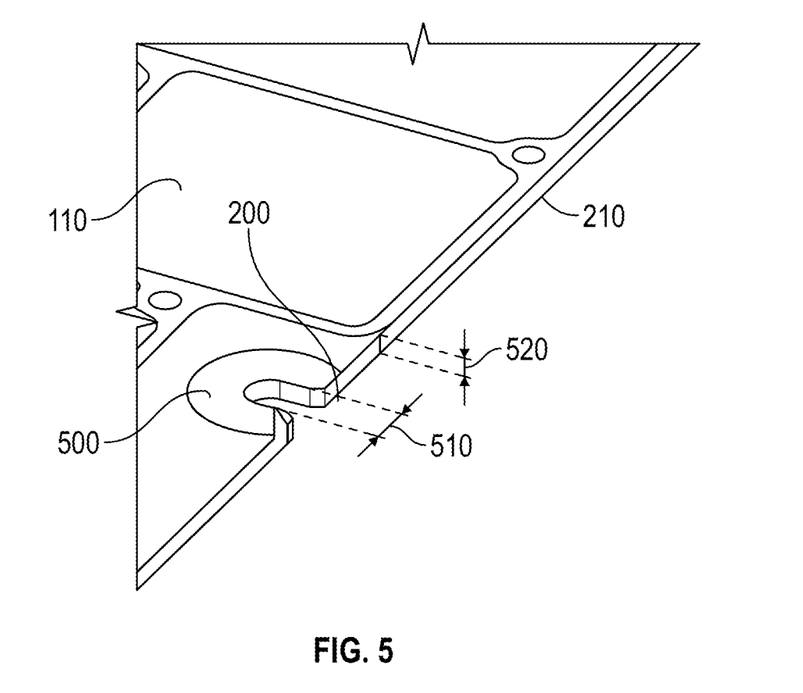
FIG. 5 shows a notch for use in the right angled blind mate interconnection of FIG. 3.

FIG. 4 shows an alignment pin 220 for use as the complementary alignment feature in the right angled blind mate interconnection 130 of FIG. 3. FIG. 5 shows a notch 200 for use as the first alignment feature in the right angled blind mate interconnection 130 of FIG. 3. As discussed above, the first alignment feature may be a notch or slot 200 integrated into an edge 210 of the first circuit board 110. When the first connector 140 is provided on the first circuit board, one such notch or slot 200 may be provided adjacent each edge of the corresponding connector. Where the first connector 140 is female, the notch 200 is aligned with the direction of the sockets 170. Alternatively, where the first connector 140 is male, the notch 200 is aligned with the direction of the connection pins 160.

The notch 200 may be provided with a surrounding zone 500 provided as an insulating zone. The first circuit board 110 may be initially manufactured with such insulating zones 500 integrated as designated locations for notches 200. Alternatively, an insulating zone 500 may be superficially added to the surface of the circuit board following the planning of the various interconnections, during printing of the various layers of the circuit board, or following the locating of the first connector 140.

The complementary alignment feature is shown as an alignment pin 220. Such an alignment pin 220 would typically be fixed to the mounting surface 190 of the chassis 180 prior to the introduction of the first circuit board 110. The second circuit board 120 is typically fixed the chassis 180 adjacent the alignment pin 220 prior to the introduction of the first circuit board 110.

As noted above, in the embodiment shown in FIGS. 1-3, the first alignment feature comprises two notches 200 in the edge 210 of the first circuit board 110 adjacent opposite ends of the first connector 140 and aligned with the sockets 170 of the connector. The second circuit board 120 is fixed to the chassis 180 and the complementary alignment feature comprises two alignment pins 220 fixed to the mounting surface 190 and extending perpendicular to the mounting surface 190 adjacent opposite ends of the second connector 150, in this case being a male connector.

As shown in FIG. 4, the alignment pin 220 has a head 400 having a width 410 larger than a width 510 of the notch 200, and a shaft 420 extending from the mounting surface 190 to the head 400. The shaft 420 has a length 430 longer than a thickness 520 of the first circuit board 110 and has a diameter 440 smaller than the width 510 of the notch.

While the length 430 of the shaft 420 is larger than the thickness 520 of the first circuit board, it is not much larger. Instead, it is substantially similar to the thickness 520 of the first circuit board 110 with an added tolerance. For example, the first circuit board 110 may be approximately 2.3 mm thick, and the shaft may be 2.5 mm long. Similarly, the width 510 of the notch 200 may be larger than the diameter 440 of the shaft 420 of the alignment pin 220 by only a tolerance. For example, the slot 200 may be 5.5 mm wide and the diameter 440 of the shaft 420 may be 5 mm.

As shown, the alignment pin may have a base 450, which may be sized and shaped to fit into the various holes 230 of the chassis 180, thereby allowing the alignment pin to be fixed in place. The base 450 has a smaller diameter than the diameter 440 of the shaft 420, and therefore the shaft sits above the mounting surface 190. A lower surface 460 of the head 410 of the alignment pin 220 is tapered relative to the mounting surface 190 of the chassis 180 when fixed in place. As such, when the head 410 taken as a whole may be substantially parallel to the mounting surface 190, the tapered lower surface 460 is angled relative to the surface. For example, the lower surface 460 may be tapered at 45 degrees relative to the horizontal. The angle of the taper typically defines a maximum allowable approach angle of the first circuit board 110 relative to the mounting surface 190 during alignment.

In some embodiments, as shown, the lower surface 460 may have two or more segments 470, 480 at different radial distances from the shaft 420 having different taper angles. As such, the lower surface 460 of the head 400 may have a first segment 470 having a first angle relative to the mounting surface 190 at a first radial distance from the shaft 420. The lower surface 460 may then have a second segment 480 having a second angle relative to the mounting surface 190 at a second radial distance from the shaft 420. Typically, the segment 480 closer to the shaft 420 has a smaller angle than the segment 470 farther from the shaft. As such, the maximum allowable approach angle is reduced as the first edge 210 approaches a plane parallel to the first edge and defined by the shaft 420.

Further, because the length 430 of the shaft 420 is substantially similar to or slightly larger than the thickness 520 of the first circuit board 110, once the first edge 210 passes the shaft 420, it can proceed further only if it is flat against the mounting surface 190 of the chassis 180.

Figure 6A:
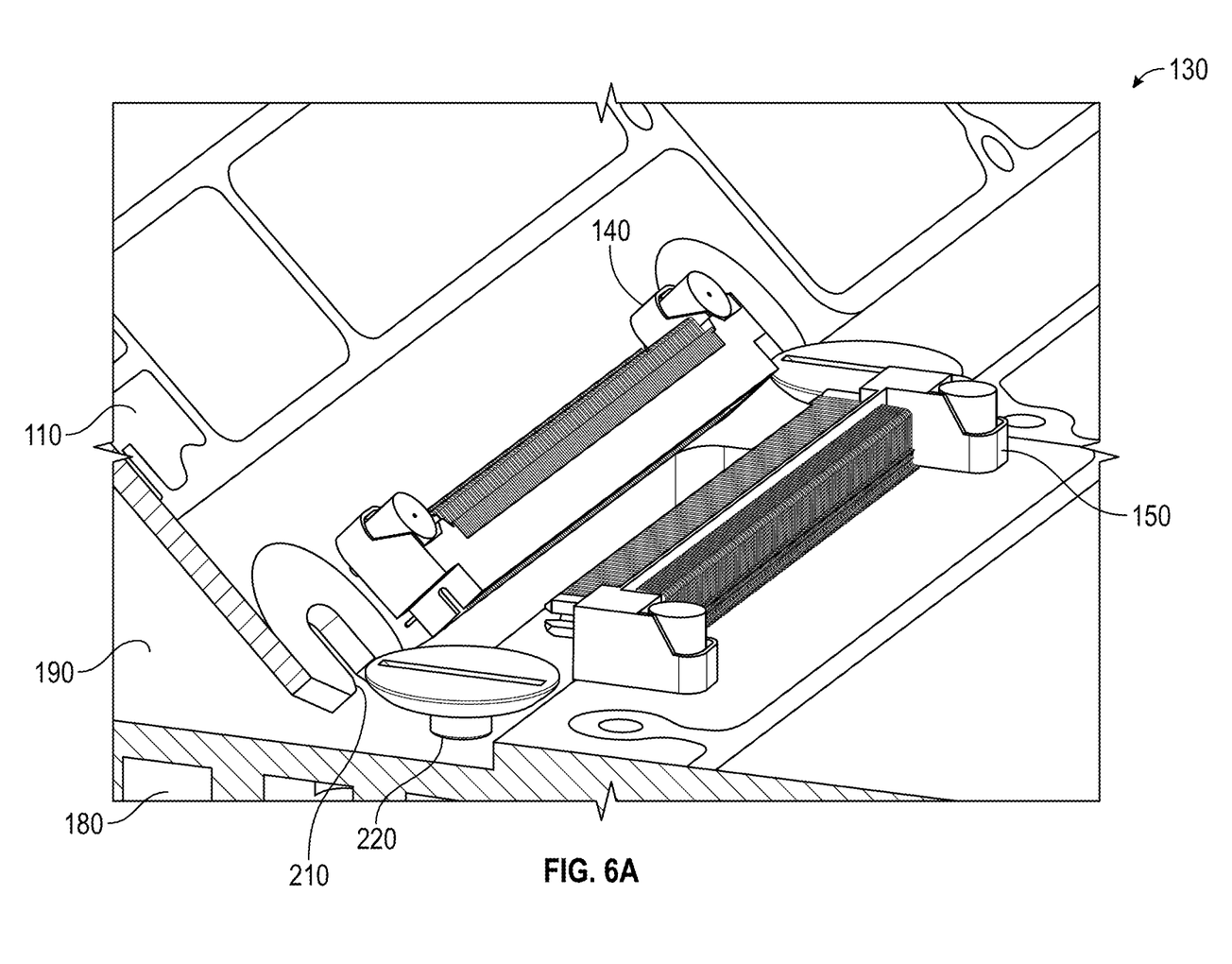
FIGS. 6A and 6B show an initial approach angle of a first circuit board being connected to a second circuit board already located on a chassis.
Figure 6B:
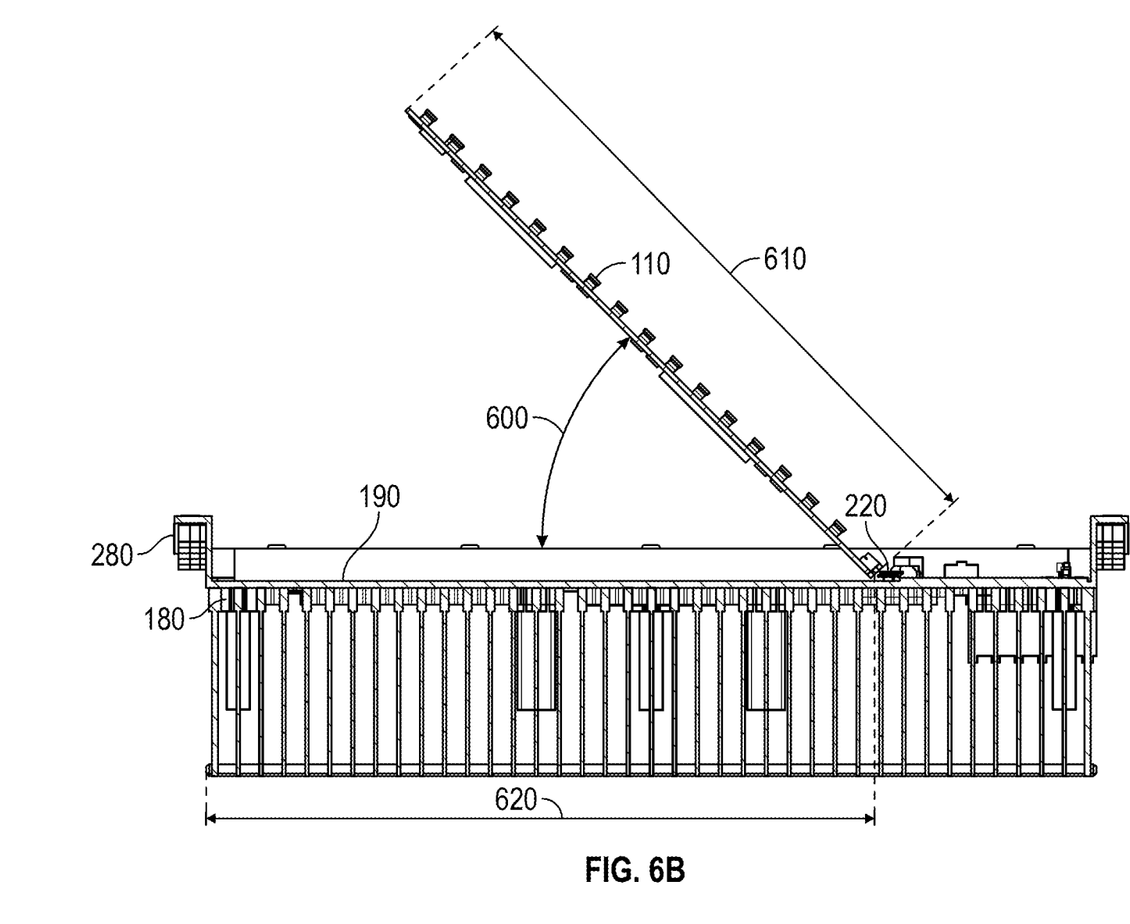
Figure 7:
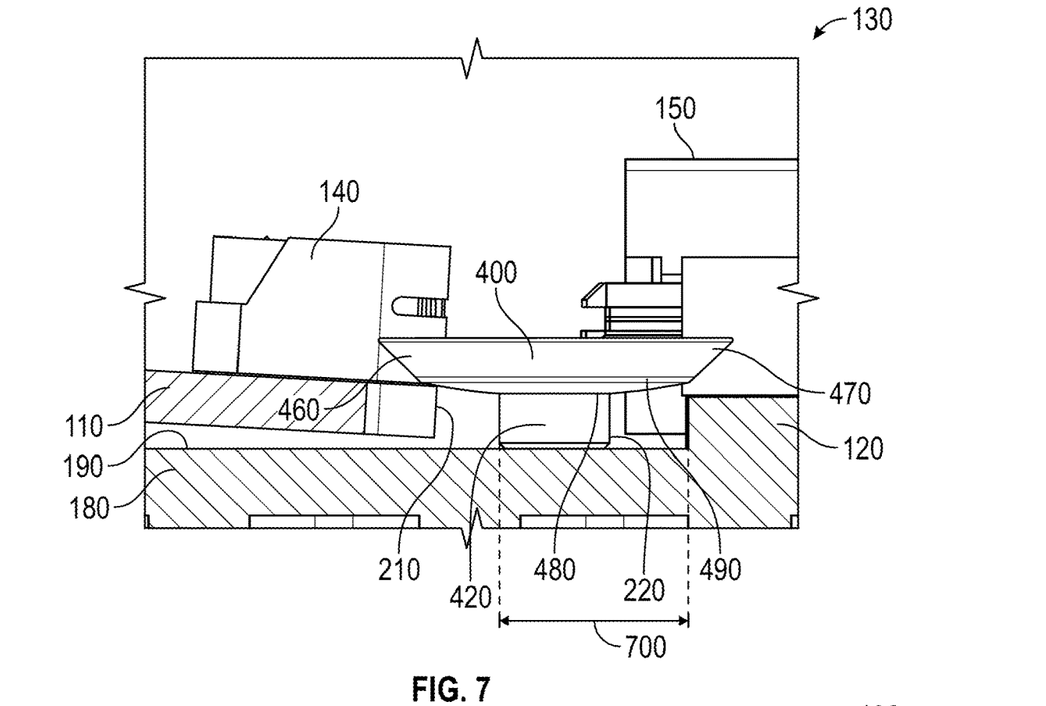
FIG. 7 shows a continued approach of the first circuit board to the second circuit board of FIG. 6A.
Figure 8:
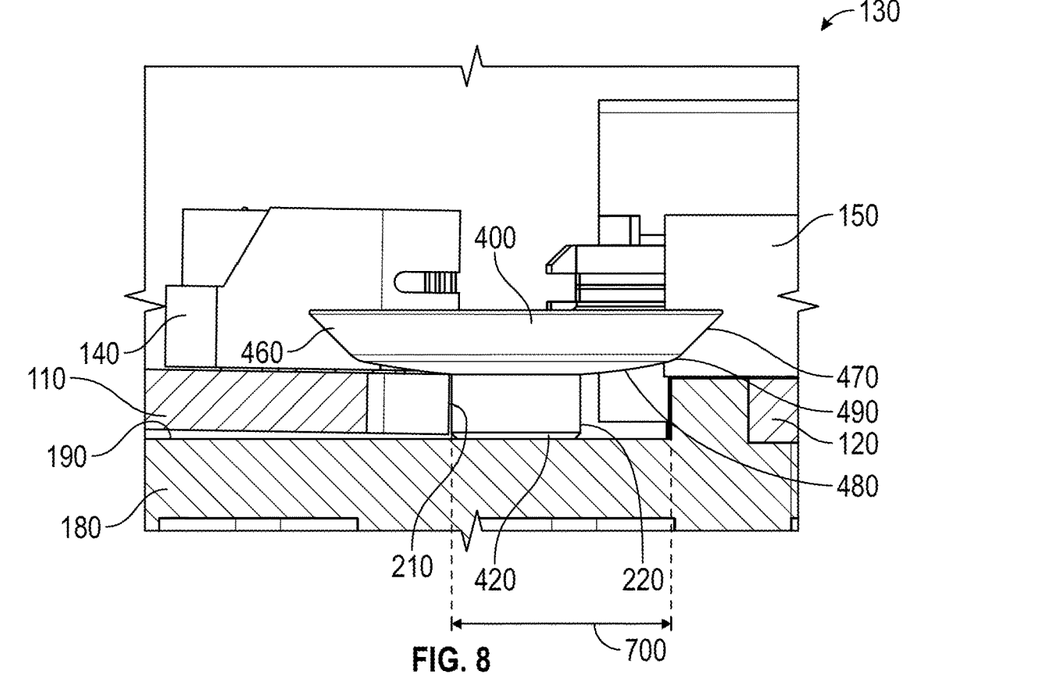
FIGS. 8, 9, and 10 show the continued approach and ultimate fixation of the first circuit board to the second circuit board of FIG. 6A using the right angled blind mate interconnection of FIG. 3.
Figure 9:
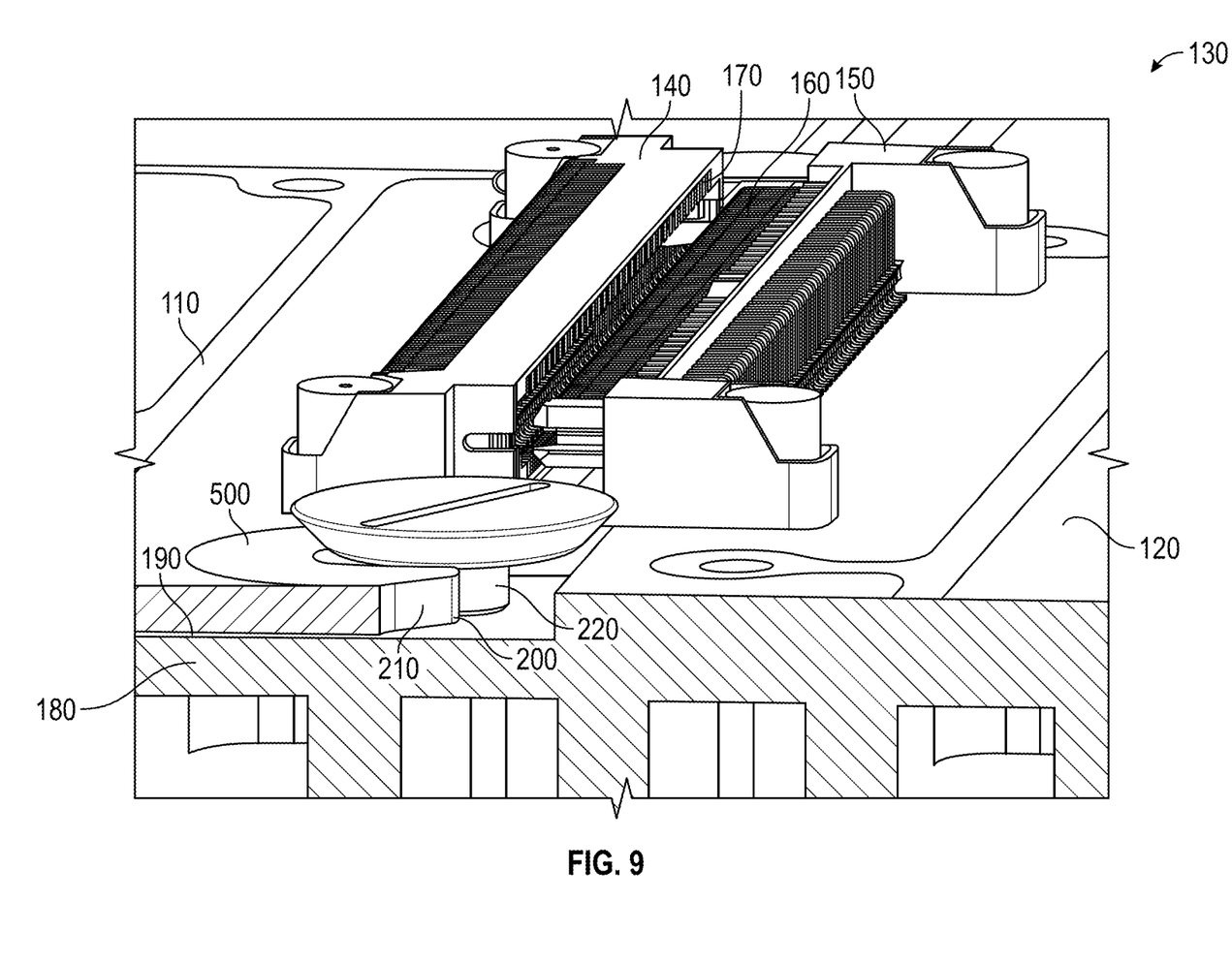
Figure 10:
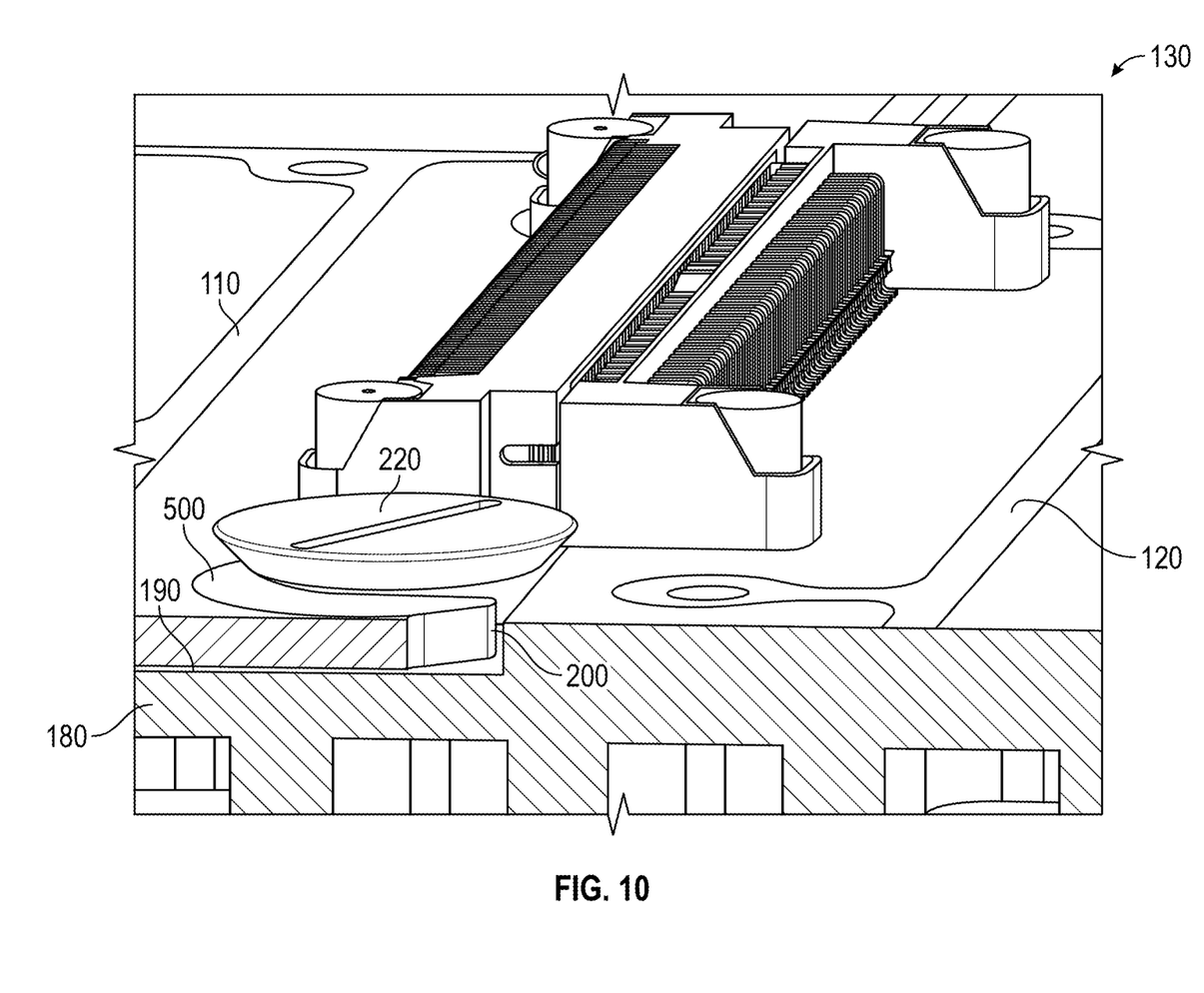

FIGS. 6A and 6B show an initial approach angle of a first circuit board 110 being connected to a second circuit board 120 already located on a chassis 180. FIG. 7 shows a continued approach of the first circuit board 110 to the second circuit board 120 of FIG. 6A. FIGS. 8, 9, and 10 show the continued approach and ultimate fixation of the first circuit board 110 to the second circuit board 120 of FIG. 6A using the right angled blind mate interconnection 130 of FIG. 3.

As discussed above, the lower surface 460 of the head 400 of the alignment pin 220 is tapered, thereby controlling a potential approach angle of the first circuit board 110 relative to the mounting surface 190 of the chassis 180 during alignment.

FIG. 6A shows such an angled approach of the first circuit board 101 and FIG. 6B shows a side profile view of the approach. As shown in FIG. 6B, where the taper is approximately 45 degrees, the approach angle 600 of the first circuit board 110 is similarly limited to approximately 45 degrees.

As noted above, the chassis 180 may have a sidewall 280 extending perpendicular to the mounting surface 190 which limits the space available for positioning the first circuit board 110 on the mounting surface of the chassis when introducing it to the second circuit board 120. The first circuit board 110 may have a length 610 in the direction of the sockets or connection pins of the corresponding connector 140. Similarly, the mounting surface 180 may have a length 620 from the alignment pin 220 to the sidewall 280 smaller than the length 610 of the first circuit board 110. Accordingly, a controlled approach angle may be required in order to clear the sidewall 280 during assembly.

As shown in FIG. 7, where the lower surface 460 of the head 400 of the alignment pin 220 has two segments 470, 480, the approach angle of the first circuit board 110 is controlled by the taper angle of the two segments in turn. Accordingly, FIG. 7 shows the transition to the second segment 480, at which point the taper angle reduces the approach angle significantly from that allowed by the first segment 470. In this way, as the first edge 210 passes a boundary 490 between the first segment 470 and the second segment 480, the approach of the first circuit board 110 is reduced significantly.

Accordingly, the pins 160 or sockets 170 of the first connector 140 come into alignment with the complementary pins or sockets of the second connector 150 as the first edge 210 approaches the edge 240 of the second circuit board 120.

FIG. 8 shows the first edge 210 of the first circuit board 110 approaching the shaft 420 of the alignment pin 220 and FIG. 9 shows the shaft 420 entering the notch 200. As noted above, the length 430 of the shaft and the thickness 520 of the first circuit board 110 require that once the shaft 420 of the alignment pin 120 enters the notch 200, the first circuit board 110 is forced parallel to and flat on the mounting surface 190 of the chassis 180 and can only translate towards the second circuit board 120 in the direction of the pins 160 and sockets 170 of the connectors 140, 150.

As shown, a distance 700 between the second circuit board 120 and the far edge of the shaft 420 of the alignment pin 220 is larger than a length of connection pins 160 of the second connector 150, where the second connector is male. Accordingly, the first circuit board 110 is forced parallel to and flat upon the mounting surface 190 and is only allowed to translate parallel to the first edge 210 before the first connector 140 is within range of the connection pins 160 of the second connector 150.

By forcing alignment and allowing only controlled translation of the first circuit board 110 prior to any potential contact between the connectors 140, 150, alignment can be enforced and damage to fragile pins of high speed connectors can be avoided. FIG. 10 illustrates the fully assembled interconnection 130 once the connectors 140, 150 are fully connected.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A circuit board connection system comprising:
   a first circuit board having a first connector;
   a second circuit board having a second connector for mating with the first connector;
   a chassis for mounting the first circuit board and the second circuit board, wherein, when assembled, the first circuit board and the second circuit board lie parallel to a mounting surface of the chassis;
   at least one first alignment feature fixed to or integrated into the first circuit board; and
   at least one complementary alignment feature fixed to or integrated into the second circuit board or the mounting surface of the chassis,
   wherein an interaction between the first alignment feature and the complementary alignment feature forces alignment of the first connector with the second connector as the first circuit board is moved towards the second circuit board along the mounting surface of the chassis,
   wherein the at least one complementary alignment feature is an alignment pin fixed to the mounting surface and extending perpendicular to the mounting surface,
   wherein the alignment pin has a head comprising a lower surface, and
   wherein the lower surface of the head of the alignment pin is tapered.

2. The circuit board connection system of claim 1 wherein one of the first and second connectors is a female connector and the other of the first and second connectors is a male connector, and wherein the at least one alignment feature, upon engagement with the at least one complementary alignment feature, allows only linear motion along a plane of the chassis in a direction of connection pins of the male connector.

3. The circuit board connection system of claim 2 wherein the at least one alignment feature is a notch in a first edge of the first circuit board aligned with sockets of the female connector.

4. The circuit board connection system of claim 3 wherein the second circuit board is located on the chassis adjacent the alignment pin.

5. The circuit board connection system of claim 4 wherein the second circuit board is fixed to the chassis prior to an introduction of the first circuit board.

6. The circuit board connection system of claim 4 wherein the alignment pin has a head having a width larger than a width of the notch and a shaft extending from the mounting surface to the head longer than a thickness of the first circuit board.

7. The circuit board connection system of claim 3 wherein the mounting surface of the chassis has a wall extending perpendicular from the mounting surface, and wherein the first circuit board has a length in the direction of the sockets of the female connector, and wherein a distance from the alignment pin to the wall is less than the length of the first circuit board.

8. The circuit board connection system of claim 6 wherein an angle of the taper defines a maximum allowable approach angle of the first circuit board relative to the mounting surface during alignment.

9. The circuit board connection system of claim 8 wherein the taper of the lower surface of the head of the alignment pin has at least a first segment having first angle relative to the mounting surface at a first radial distance from the shaft and a second segment having a second angle relative to the mounting surface at a second radial distance from the shaft, the second angle being smaller than the first angle, such that the maximum allowable approach angle is reduced as the first edge approaches a plane parallel to the first edge defined by the shaft.

10. The circuit board connection system of claim 8 wherein the length of the shaft is substantially similar to the thickness of the first circuit board with an added tolerance, such that after the first edge passes the plane defined by the shaft, the first circuit board can be translated further towards the second circuit board only if flat on the mounting surface.

11. The circuit board connection system of claim 10 wherein a distance between the second circuit board and the shaft of the alignment pin is larger than a length of the connection pins of the male connector.

12. The circuit board connection system of claim 1 wherein the at least one alignment feature is two parallel notches in the first circuit board adjacent opposite ends of the female connector and aligned with sockets of the female connector, and wherein the second circuit board is fixed on the chassis and the at least one complementary alignment feature is two alignment pins fixed to the mounting surface and extending perpendicular to the mounting surface adjacent opposite ends of the male connector.

13. The circuit board connection system of claim 12 wherein each of the two alignment pins has a head having a width larger than a width of the notch and a shaft extending from the mounting surface to the head larger than a thickness of the first circuit board, and wherein a lower surface of the head of each alignment pin is tapered, an angle of the taper defining a maximum allowable approach angle of the first circuit board relative to the mounting surface during alignment.

14. The circuit board connection system of claim 1 wherein the chassis provides cooling features opposite the mounting surface.

15. The circuit board connection system of claim 1 wherein the mounting surface comprises a detent adjacent a mounting location of the second circuit board, such that the second connector is spaced apart from the mounting surface.

16. The circuit board connection system of claim 1 wherein the first connector and the second connector are high-speed right-angle connectors.

17. The circuit board connection system of claim 1 wherein the first connector and the second connector are data connectors.

* * * * *